United States Patent
Ono et al.

(10) Patent No.: US 7,968,980 B2
(45) Date of Patent: Jun. 28, 2011

(54) SUPPORT MEMBER FOR MOUNTING A SEMICONDUCTOR DEVICE, CONDUCTIVE MATERIALS, AND ITS MANUFACTURING METHOD

(75) Inventors: Masato Ono, Sagamihara (JP); Hideyuki Kanno, Kawaguchi (JP); Koki Matsumoto, Komatsushima (JP)

(73) Assignee: Nichia Corporation, Anan-shi (JP)

( * ) Notice: Subject to any disclaimer, the term of this patent is extended or adjusted under 35 U.S.C. 154(b) by 404 days.

(21) Appl. No.: 11/712,386

(22) Filed: Mar. 1, 2007

(65) Prior Publication Data

US 2007/0205419 A1    Sep. 6, 2007

(30) Foreign Application Priority Data

Mar. 2, 2006  (JP) .................................. 2006-055671
Sep. 20, 2006  (JP) .................................. 2006-253835

(51) Int. Cl.
*H01L 33/00* (2010.01)
*H01L 21/00* (2010.01)
*H01L 23/495* (2010.01)

(52) U.S. Cl. ......... 257/668; 257/672; 257/676; 257/100

(58) Field of Classification Search ..................... 257/98, 257/99, 100, 672, 676, 92, 747, E2.193, E23.043, 257/E23.183, 668, 669, E23.06, 81
See application file for complete search history.

(56) References Cited

U.S. PATENT DOCUMENTS

| | | | | |
|---|---|---|---|---|
| 5,309,001 A | * | 5/1994 | Watanabe et al. | 257/99 |
| 6,011,303 A | * | 1/2000 | Tanaka et al. | 257/692 |
| 6,747,293 B2 | * | 6/2004 | Nitta et al. | 257/99 |
| 6,849,876 B1 | * | 2/2005 | Chen et al. | 257/81 |
| 6,984,852 B2 | * | 1/2006 | Wang et al. | 257/99 |
| 2003/0134445 A1 | * | 7/2003 | Kubby | 438/31 |
| 2004/0129946 A1 | * | 7/2004 | Nagai et al. | 257/98 |
| 2004/0201025 A1 | * | 10/2004 | Barnett et al. | 257/79 |
| 2005/0093146 A1 | | 5/2005 | Sakano | |
| 2005/0133807 A1 | * | 6/2005 | Park et al. | 257/99 |
| 2005/0253157 A1 | * | 11/2005 | Ohashi et al. | 257/95 |
| 2006/0102923 A1 | * | 5/2006 | Oda et al. | 257/100 |

FOREIGN PATENT DOCUMENTS

| | | | | |
|---|---|---|---|---|
| JP | 59149072 A | * | 8/1984 | |
| JP | 63081992 A | * | 4/1988 | |
| JP | 02114572 A | * | 4/1990 | |
| JP | 2004-200253 A | | 7/2004 | |

OTHER PUBLICATIONS

Partial European Search Report, directed to EP07102427, issued on Jun. 5, 2009, 4 pages.

* cited by examiner

*Primary Examiner* — Teresa M Arroyo

(74) *Attorney, Agent, or Firm* — Smith Patent Office

(57) ABSTRACT

A semiconductor device comprises a support member having a pair of first conductive materials and a pair of second conductive materials on an insulating substrate, and a sealing member covering a semiconductor element arranged on the support member, wherein the support member has an insulating portion where the insulating substrate is exposed between the pair of the first conductive materials, and at least one of the pair of the second conductive materials is arranged along the side of the insulating portion, and the sealing member is disposed so that the sealing member is over at least a part of at least one of the first conductive materials and the second conductive materials.

17 Claims, 9 Drawing Sheets

SUPPORT MEMBER FOR MOUNTING A SEMICONDUCTOR DEVICE, CONDUCTIVE MATERIALS, AND ITS MANUFACTURING METHOD

BACKGROUND OF THE INVENTION

1. Field of the Invention

The present invention relates to a support member mounting a semiconductor element such as a light emitting element and a photodetector, and a semiconductor device employing the support member, and particularly relates to a semiconductor device provided with a high-output and high-luminance semiconductor element mounted thereon and excellent in heat resistance, heat radiation and reliability.

2. Discussion of the Related Art

In recent years, a high-output semiconductor light emitting element such as light emitting diode (LED) and a laser diode (LD) has been developed. Such a semiconductor light emitting element is mounted on a package, which is a support member provided with electrodes for supplying electric power to the semiconductor light emitting element, to assemble a light emitting device.

Examples of a package for hermetically sealing a semiconductor light emitting element such as a light emitting diode and a laser diode include a so-called can package. A can package 5 shown in FIG. 14 as a conventional example comprises a stem 3 having through-holes through each of which an electrode 2 is inserted and fixed via an insulating material, and a cap 6 composed of a light transmitting portion 7 made of glass fitted into a metal ring. A semiconductor light emitting element 1 is disposed to the stem 3 and the electrodes of the semiconductor light emitting element 1 and the electrodes 2 provided to the stem 3 are connected via conductive wires 4. In the can package 5, the semiconductor light emitting element 1 disposed to the stem 3 is hermetically sealed by resistance welding of the stem 3 and the cap 6. That is, one electrode is contacted to the metal ring of the cap 6 and another electrode is contacted to the stem 3 and voltage is applied. By the Joule heat consequently generated, the metal ring of the cap 6 is welded and fixed to the stem 3, so that the semiconductor light emitting element is hermetically sealed. Such a can package 5 is a package excellent in airtightness, in which moisture and the like from the outside is prevented from entering therein.

When producing a semiconductor device having a hermetically sealed semiconductor element, it is preferable to weld the cap to a support member having an insulating substrate provided with a conductive wiring rather than to a metal stem described above. This is because efficient mass-production of the semiconductor devices can be achieved by dividing the substrate into individual support members after welding the caps to the substrate which is a collective of support members to form semiconductor devices.

However, for example, as described in Japanese Laid-open Patent Application No. 2004-200253, in a support member formed by arranging a metal material to an insulating substrate, warpage is generated in the entire body of the support member due to a difference of thermal expansion coefficients between an insulating substrate and a metal material.

Welding a sealing member to the support member having warpage tends to reduce airtightness of the semiconductor device compared with that in the can package where the cap is welded to the metal stem. For example, generation of a gap between a flange portion of the cap and the support member results in a drop in the airtightness of the semiconductor device. When the insulating substrate to which the cap is welded has warpage, stress is concentrated on a specific location of the glass fitted to the cap, and a crack may occur at the specific location and propagate in the glass. Also, when welding the cap to the substrate, due to a pressure exerted from the electrode terminal contacted to the flange portion of the cap, consequent stress derived from the flange portion to the glass may cause a crack in the glass. The airtightness of the semiconductor device is reduced due to the occurrence of the crack in the glass as described above.

In the light emitting device according to Japanese Laid-open Patent Application Publication No. 2004-200253, warpage is reduced by dividing an arrangement region for a metal material joined to the insulating substrate into multiple regions. Even if warpage is thus reduced, sufficient airtightness cannot be obtained in forming a hermetically sealed semiconductor device as described above.

Accordingly, an object of the present invention is to provide a semiconductor device with excellent airtightness, a device in which a semiconductor element is hermetically sealed by a substrate and a sealing member.

SUMMARY OF THE INVENTION

To achieve the object described above, a semiconductor device according to the present invention comprises a support member in which a pair of first conductive materials and a pair of second conductive materials which are arranged in different locations from the first conductive materials arranged on an insulating substrate, and a sealing member covering a semiconductor element disposed on the support member. The support member has an insulating portion that is an exposed portion of the insulating substrate between the pair of first conductive materials, and at least one of the pair of second conductive materials is arranged on the side of the insulating portion. The sealing member is disposed over the region that includes at least a part of the first or second conductive material region.

Also, a semiconductor device according to the present invention comprises a support member in which a pair of first conductive materials and a pair of second conductive materials which are in different locations from the first conductive materials arranged on an insulating substrate, and a sealing member covering a semiconductor element disposed on the support member. The region shapes of the pair of first conductive materials are symmetrical to each other in plan view, and the region shapes of the pair of second conductive materials are symmetrical to each other with respect to the symmetry axis of the region shapes of the first conductive materials in the plan view. The sealing member is disposed over the region that includes at least a part of the first or second conductive material region.

The region shape of the second conductive material is preferably strip-shaped and extended in a longitudinal or longer direction of the insulating substrate.

It is preferable that the insulating substrate has a third conductive material arranged on a central portion of the insulating substrate, and the region shape of the first conductive material has extended portions that are extended to the sides of the central portion to surround a part of the region shape of the third conductive material.

The first and second conductive materials are preferably covered continuously with an insulating member.

It is preferable that the sealing member has a flange portion that can be conductive or nonconductive, and the flange portion of the sealing member is elastically connected to the support member.

Further, in a method for manufacturing a semiconductor device of the present invention, the semiconductor device includes a support member having an insulating substrate and a conductive material disposed on the insulating substrate, and a sealing member having a conductive flange portion, and the method comprises a first step of arranging a pair of first conductive materials having region shapes symmetrical to each other in plan view on the insulating substrate, a second step of arranging a pair of second conductive materials having region shapes symmetrical to each other with respect to the first conductive material regions in the plan view on the insulating substrate, and a third step of welding a flange portion of a sealing member on a region including at least a part of the first or second conductive material.

The flange portion of the sealing member is preferably elastic to the insulating substrate.

According to the present invention, a semiconductor device with excellent airtightness can be provided, by reducing warpage of a substrate in a semiconductor device in which a semiconductor element is hermetically sealed by the substrate and a sealing member.

DETAILED DESCRIPTION OF THE PREFERRED EMBODIMENTS

Figure 1:
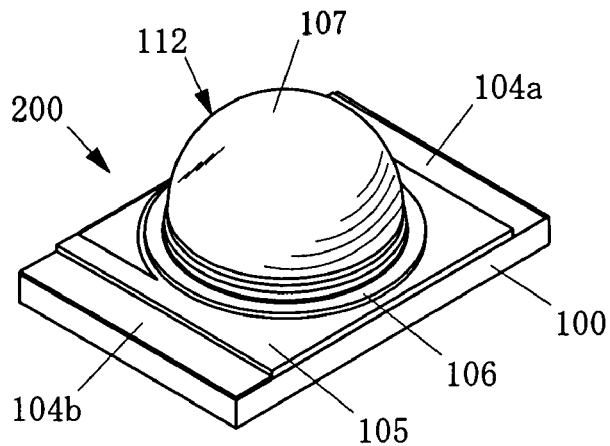
FIG. 1 is a schematic perspective view illustrating an example of the present invention.

The preferred embodiments of the present invention will be described below with reference to the accompanying drawings. Herein, the form of the following embodiments are intended as examples of a semiconductor device that are representative of the technology behind the present invention, and any limitation of the scope of the invention by the embodiments is not intended. In addition, the present specification will by no means limit the elements described in claims to the elements described in the embodiments. Especially, size, material, shape, and the relative configuration etc. of the constructive elements described in the preferred embodiments are for illustration only, and do not intend to limit the invention therein, unless specifically described. In the drawings, the size and the positional relationship of the members or components may be exaggerated for clarity. Further, in the description below, identical elements or elements of the same quality are assigned the same names and reference numerals and detailed description thereof will be arbitrarily omitted. In each constituent of the present invention, multiple constituents may be constructed using the same element so that one element can serve as multiple constituents, or vice versa, and a function of an element may be shared by multiple elements.

The inventors of the present invention have performed various research to reduce warpage of a support member so as to prevent damage to the sealing member provided on the support member in a semiconductor device which comprises a semiconductor element, a pair of positive and negative electrodes, a support member having an insulating substrate on which the electrodes are disposed, and a sealing member covering the semiconductor element. As a result, in a first embodiment of the present invention, a support member comprises a pair of first conductive materials and a pair of second conductive materials which are different from the first conductive materials arranged on an insulating substrate, and a sealing member covering a semiconductor element disposed on the support member. The support member has an insulating portion that is an exposed portion of the insulating substrate between the pair of first conductive materials, and at least one of the pair of second conductive materials is arranged on the side of the insulating portion, and the sealing member is disposed on the region that includes at least a part of the first or the second conductive material region, and thereby the difficulties have been overcome.

In a second embodiment of the present invention, a support member has an insulating substrate, a pair of first conductive materials arranged on the insulating substrate and a pair of second conductive materials arranged on the insulating substrate separately from the first conductive materials, in the region on which a sealing member is disposed. Region shapes of the pair of first conductive materials are symmetrical to each other in plan view, and region shapes of the pair of second conductive materials are symmetrical to each other in plan view and symmetrical to each other with respect to the region shapes of the first conductive materials. Moreover, the sealing member is disposed on a region including at least a part of region of the first or second conductive material, and thus the difficulties have been overcome. The present invention includes the construction according to at least one of the first and second embodiments, and thereby the effect of the present invention can be achieved.

<Semiconductor Device>

Figure 2:
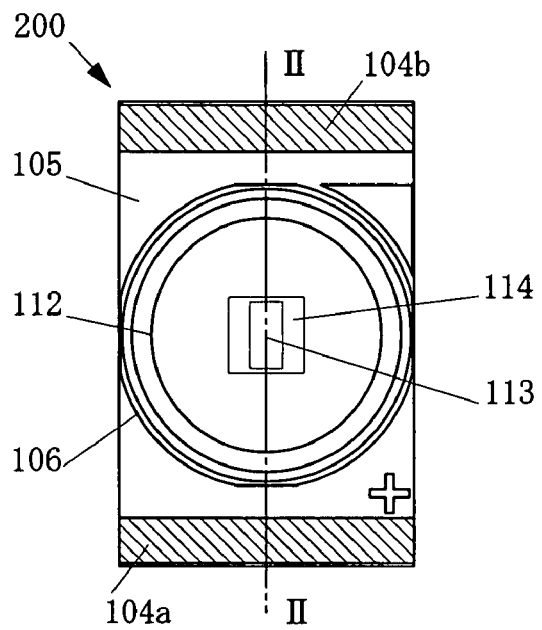
FIG. 2 is a schematic top view illustrating an example of the present invention.
Figure 3:
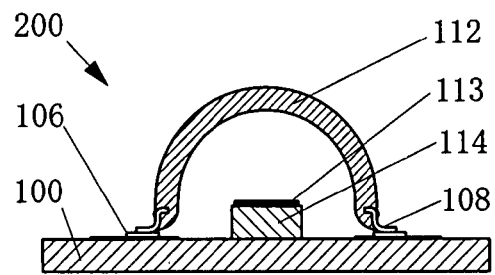
FIG. 3 is a schematic cross-sectional view illustrating an example of the present invention.

A semiconductor device according to the present embodiment will be described below with reference to the accompanying drawings. FIG. 1 shows a schematic perspective view of a semiconductor device 200 according to the present embodiment. FIG. 2 shows a schematic top view of the semiconductor device 200 according to the present embodiment. FIG. 3 shows a schematic cross-sectional view of the semiconductor device 200 according to the present embodiment, taken along II-II direction shown in FIG. 2.

As shown in FIGS. 1 to 3, the semiconductor device 200 of the present embodiment comprises a semiconductor element 113, a support member 100 having an insulating substrate provided with conductive materials to form a pair of positive and negative electrodes, a sealing member 112 covering the semiconductor element 113 disposed on the support member 100.

Figure 4:
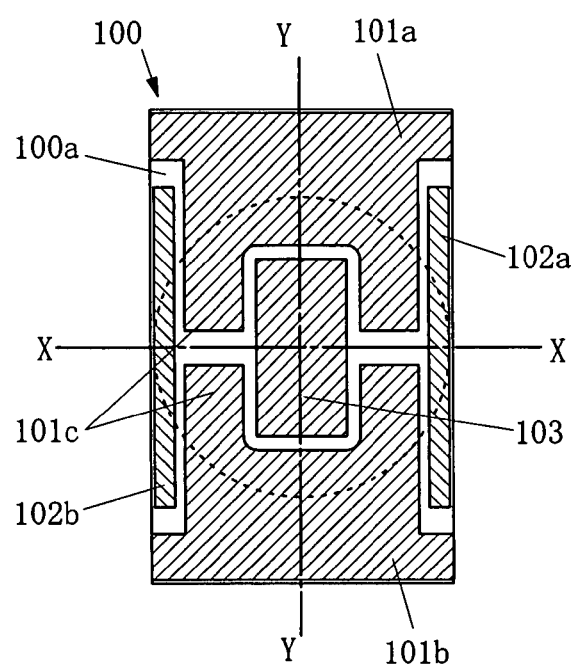
FIG. 4 is a schematic top view illustrating a manufacturing process according to an example of the present invention.

As shown in FIG. 4, in the support member 100 of the present embodiment, a pair of first conductive materials 101a and 101b, used as wiring for connecting them to the semiconductor element 113, are disposed on the main surface of the insulating substrate so as to be symmetrical to each other relative to the center of the arrangement region. Moreover, a pair of second conductive materials 102a and 102b having an arrangement pattern symmetrical to each other are disposed on the insulating substrate separately from the first conductive materials 101a and 101b, so as to be symmetrical to each other with respect to the arrangement pattern of the first conductive materials 101a and 101b in plan view. In the present embodiment, outer edges of the regions of the first to third conductive materials are straight, but not limited thereto. The outer edges of the regions of the first to third conductive materials may be curved or straight, or a combination thereof.

In the support member of the present embodiment, "region shapes of each conductive materials are symmetrical to each other" refers that they are in line symmetry with a virtual straight line passing through the center of a region on which the sealing member is disposed, or in point symmetry with a center point of the region.

For example, in FIG. 4, the region of the support member on which the sealing member is disposed is provided within a circle indicated by a dotted line. Here, a dotted line X-X passing through the center of the dotted circle and a dotted line Y-Y perpendicular to the dotted line X-X are assumed. Then, in the regions 101a and 101b on which the pair of first conductive materials are disposed, the region shape of the first conductive material 101a is in line symmetry with the region shape of the first conductive material 101b with respect to the dotted line X-X. In addition, the region shape of the second conductive material 102a is in line symmetry with the region shape of the second conductive material 102b with respect to the dotted line Y-Y that is a common symmetry axis dividing each region of the first conductive material 101a and 101b into two parts. The pair of conductive materials 101a and 101b are also in line symmetry with respect to the dotted line Y-Y. Moreover, the pair of second conductive materials 102a and 102b are also in line symmetry with respect to the dotted line X-X.

Alternately, in the region shapes of the pair of first conductive materials 101a and 101b and second conductive materials 102a and 102b, the region shapes of the first conductive material 101a and the second conductive material 102a are respectively in point symmetry with region shapes of the first conductive material 101b and the second conductive material 102b with respect to the center (intersection of the dotted lines X-X and Y-Y) of the arrangement region of the sealing member.

With the support member according to the present embodiment, the stress due to a difference of thermal expansion coefficient between the conductive materials and the insulating substrate is assumed to be distributed uniformly in each direction on the insulating substrate on which the conductive materials are disposed. Consequently, deformation of the substrate caused by warpage can be reduced in the entire support member, and with the hermetic sealing thus obtained, a semiconductor device of high airtightness and reliability can be provided. The effect of the present invention is not limited to the cases where a sealing member is provided to a support member to hermetically seal a semiconductor element. That is, because deformation of the substrate caused by warpage is reduced in the entire support member, accuracy in mounting a semiconductor element or an additional support member (for example, a submount) used in mounting a semiconductor element can be improved.

The regions of the first conductive materials 101a and 101b and the second conductive material 102a and 102b of the present embodiment are formed at a predetermined distance between their outer edges of the arrangement patterns. That is, in plan view of the main surface of the support member, the regions of the first conductive materials 101a and 101b are separated by an insulating portion that is an exposed portion of the insulating substrate at the center portion of the substrate, and the regions of the pair of the second conductive materials 102a and 102b are arranged at the sides of the regions of the first conductive materials with the insulating portion interposed therebetween. The regions of the second conductive materials 102a and 102b are not needed to be disposed with the insulating portion interposed therebetween as in the present embodiment, as along as flatness of the substrate can be obtained at the predetermined position (for example, within the dotted circle shown in FIG. 4) where the sealing member is disposed, and at least one region of the second conductive materials is needed to be disposed across the side of the insulating portion.

Accordingly, abrupt change in the difference of the thermal expansion coefficient between the conductive materials and the insulating substrate can be reduced in the direction where the regions of the pair of first conductive materials 101a and 101b are disposed, so that warpage of the insulating substrate can be reduced.

That is, it is assumed that warpage is generated by the difference of the degree of stress exerted on the insulating portion and the region where the first conductive material is disposed, due to the difference of thermal expansion coefficient between the conductive material and the insulating substrate. However, as in the support member of the present invention, when the conductive material is disposed at the side of the insulating portion, the difference of the thermal expansion coefficient between the conductive material and the insulating substrate is assumed to be substantially equal in each region of the main surface where the pair of the first conductive materials are disposed. Therefore, nonuniformity in the stress exerted on the substrate is reduced in the direction through the regions of the second conductive materials 102a and 102b toward the pair of first conductive materials, so that warpage of the substrate can be reduced and the semiconductor device with high airtightness and high reliability can be obtained.

The regions of second conductive materials 102a and 102b are insulated from the pair of first conductive materials 101a and 101b, and a part of the regions of the second conductive materials 102a and 102b may be interposed between the regions of the first conductive materials 101a and 101b. Thus, the area of the insulating substrate covered with a conductive material increases. Therefore, nonuniformity in the stress exerted on the substrate can be further reduced, so that warpage of the insulating substrate can be further reduced.

In addition, the regions of the pair of second conductive materials 102a and 102b are preferably stripe-shaped elongated in the longitudinal direction of the insulating substrate. For example, as shown in FIG. 4, in plan view of the regions of the first conductive materials 101a and 101b, the regions of the second conductive materials 102a and 102b are disposed so as to interpose the regions of the first conductive materials 101a and 101b therebetween. Further, the regions of the second conductive materials 102a and 102b are disposed on the insulating substrate 100a so as to extend respectively toward the corners in the longitudinal direction of the rectangular main surface where each conductive material is disposed thereon. Accordingly, warpage generated in the longitudinal direction of the insulating substrate can be controlled. In the present specification, the term "main surface" of the support member refers to a surface with the largest area among the surfaces comprising the outer shape of the plate member-shaped substrate, on where the semiconductor element is mounted.

It is preferable that the insulating substrate 100a has a region of a third conductive material 103 disposed in a central portion thereof and the regions of the first conductive materials 101a and 101b respectively have extended portions 101c extending along the sides of the central portion to surround a part of the region of the third conductive material 103. Here, the region of the third conductive material 103 is insulated and separated from the regions of the first and second conductive materials. In the insulation and separation shown in FIG. 4 of the present embodiment, outer edges of the regions of the conductive materials are formed respectively with predetermined distances, but not limited thereto and the conductive materials may be partially connected, provided that a short-circuit is not caused. The distances between the outer edges of a region of the conductive material and the outer edges of other regions of the conductive material are preferably substantially the same in each direction. As described above, when the conductive materials are disposed apart from each other, warpage of the support member can be reduced. Further, when the regions of the first conductive materials have the extended portions, the region of the surface of the insulating substrate covered with the conductive materials can be widened, so that warpage of the support member can be reduced.

The second conductive material preferably contains at least one metal material contained in the first conductive material. Further, each of the first to third conductive materials preferably contains at least one metal material in common. Accordingly, the difference of the thermal expansion coefficient between the conductive materials and the insulating substrate becomes nearly uniform in each direction, so that the warpage of the substrate can be reduced. For example, when a ceramic is used for the material of the insulating substrate, tungsten, molybdenum, titanium and the like can be used suitably for the material of a conductive wire provided to the ceramic substrate. Moreover, the second conductive material can also be disposed in the same process where the first conductive material is disposed as a conductive wire on an unclaimed ceramic sheet. Therefore, the support member of the present embodiment can be manufactured with high mass productivity. Further, with arranging the first conductive material and the second conductive material on the same plane of the insulating substrate, each conductive material can be disposed with good workability by way of printing or the like.

Figure 5:
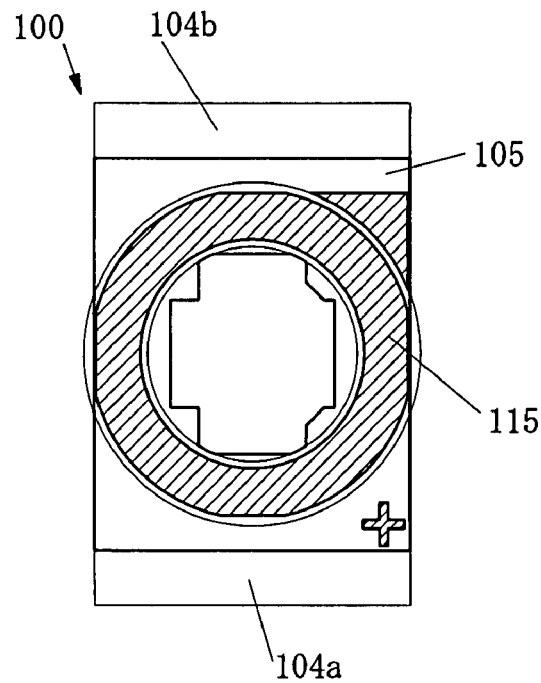
FIG. 5 is a schematic top view illustrating a manufacturing process according to an example of the present invention.
Figure 6:
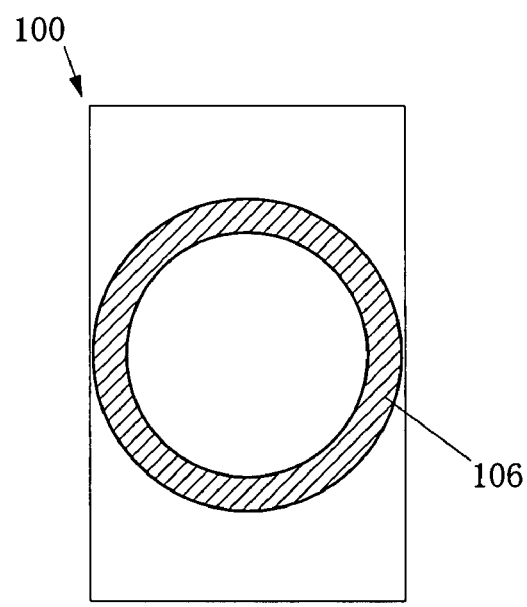
FIG. 6 is a schematic top view illustrating a manufacturing process according to an example of the present invention.

As shown in sequence in FIGS. 4 to 6, the support member of the present embodiment is formed by sequentially stacking each conductive material, the insulating member 105 covering the conductive materials, and a conductive plate member 106 for disposing the sealing member having a conductive flange portion, on the main surface of the insulating substrate.

As shown in FIG. 5, the first and second conductive materials are preferably covered continuously by an insulating member 105. As the material for the insulating member 105, for example, silicon dioxide, aluminum nitride or the like can be selected. Accordingly, the effect to reduce the warpage of the substrate can be improved. In the region of the main surface of the support member covered with the insulating member, the area of regions of each conductive material is preferably from 80% to 90%. With this, flatness of the region covered with the insulating member can be improved.

Figure 12:
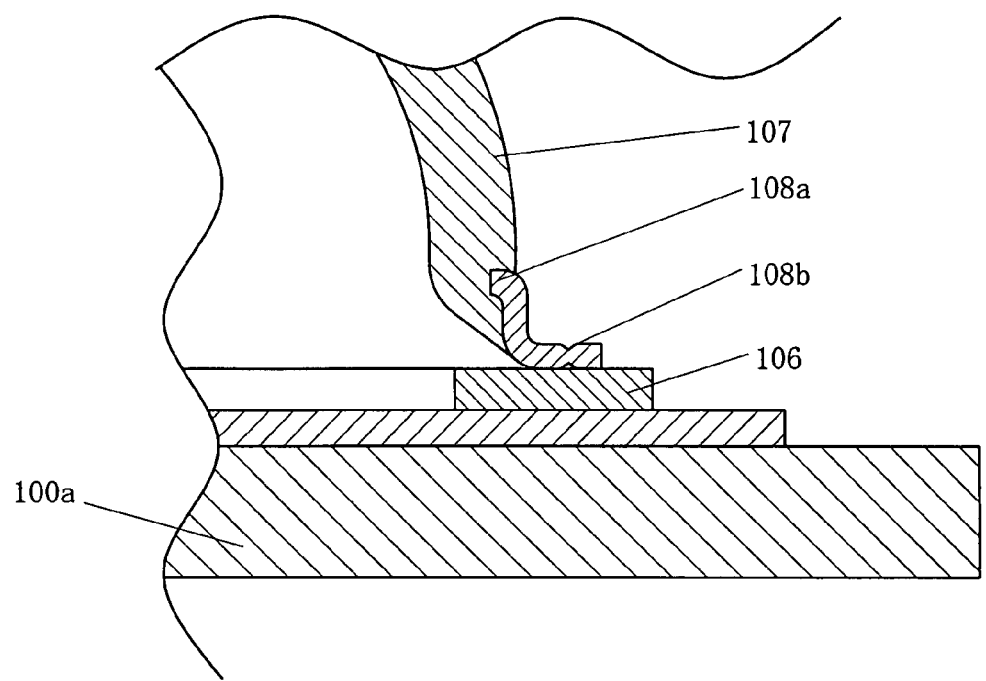
FIG. 12 is a partially sectional view schematically showing an example of the present invention.

The semiconductor device having the support member of the present embodiment is, as shown in FIG. 6, provided with a plate member 106 on a side where the semiconductor element is mounted, so as to dispose the sealing member 112 having a conductive flange portion. Here, the plate member 106 is disposed on the region that includes at least a part of the regions of the first conductive materials 101a and 101b or the second conductive materials 102a and 102b. As shown in FIG. 3, the flange portion 108 of the sealing member 112 is welded to the conductive portion of the plate member 106. FIG. 12 shows a partially sectional enlarged view of the flange portion 108 of the sealing member 112 of the present embodiment. As shown in FIG. 12, the sealing member 112 preferably has a buffer portion 108b in a the part to which the electrode terminal for welding is contacted, to reduce the pressure from the electrode terminal. The buffer portion 108b has a shape that is elastic in the direction of the plate member 106 or the main surface of the support member 100. With this, stress to the light transmitting portion (especially, a light transmitting portion comprising a glass) fitted to the sealing member from the electrode terminal for welding can be avoided. In addition, by providing the buffer portion to the sealing member, in other words, by providing a predetermined part of the flange portion as the buffer portion, the need of interposing a buffer member between the sealing member and the support member can be eliminated, so that the semiconductor device with high airtightness can be obtained.

Bonding of the flange portion of the sealing member and the conductive plate member is preferably made not only by welding but also by interposing a bonding material therebetween. Examples of such bonding materials include brazing materials made of Au or Ag, solders or eutectic materials (e.g. Au—Sn, Ag—Sn, Bi—Sn, Zn—Sn, Cu—Sn, In—Sn, and Pb—Sn). Accordingly, the sealing member can be firmly bonded to the plate member. As the bonding method of the sealing member and the plate member in the present embodiment, resistance welding will be mainly described, but it is not limited thereto.

<Method for Manufacturing the Semiconductor Device>

A method for manufacturing a semiconductor device according to the present embodiment will be described below with reference to the accompanying drawings. FIG. 1 shows a schematic perspective view of a semiconductor device produced according to the present embodiment. FIG. 2 shows a schematic top view of a semiconductor device produced according to the present embodiment. FIG. 3 shows a schematic cross-sectional view of a semiconductor device according to the present embodiment. Further, FIGS. 4 to 6 are schematic top views showing each step of sequentially disposing each conductive material and an insulating material according to a method for forming a support member of the present embodiment.

A method for producing a semiconductor device of the present invention concerns a method for producing a semiconductor device that comprises a support member having an insulating substrate and a conductive material disposed on the insulating substrate, and a sealing member that covers a semiconductor element disposed on the support member and has a conductive flange portion. In particular, the method for producing a semiconductor device of the present invention comprises at least the steps of (1) to (3) below. Accordingly, in a semiconductor device where a semiconductor element is hermetically sealed by a substrate and a sealing member, a semiconductor device with excellent airtightness can be obtained.

(1) Step of Disposing First Conductive Material

A first step according to the present embodiment comprises disposing a pair of first conductive material having region shapes $101a$ and $101b$ symmetrical to each other in plan view, on an insulating substrate. That is, it is a step of disposing a first conductive material to a pair of regions that are symmetrical to each other in plan view on an insulating substrate.

In the first step according to the present embodiment, a first conductive material can be disposed on an insulating substrate by way of, for example, disposing a metal material directly on the insulating substrate using sputtering, evaporation coating, screen printing, or plating, or bonding a plate member of the first conductive material to the insulating substrate.

(2) Step of Disposing Second Conductive Material

A second step according to the present embodiment comprises disposing a pair of second conductive material having region shapes $102a$ and $102b$ that are symmetrical to each other with respect to the symmetry axis of the regions of the first conductive materials $101a$ and $101b$ in plan view described above, on an insulating substrate. In other words, in plan view of an insulating substrate, it is a step of disposing a second conductive material to a pair of regions that are symmetrical to each other with respect to the symmetry axis of the region shapes where the first conductive material is disposed.

The second conductive material may be disposed on the insulating substrate in the similar way as disposing the first conductive material. The first and second steps described above may either be performed in different steps or in a same step. In addition, there is no need to perform the first step and the second step in order.

(3) Step of Welding Insulating Member

A third step according to the present embodiment comprises welding a flange portion of a sealing member on a region including at least a part of the regions of the first conductive materials $101a$ and $101b$ or second conductive material $102a$ and $102b$. For example, as shown in FIGS. 2, 4, 5 and 6, an annular metal plate member 106 is disposed via the insulating material 105 on the region (within a dotted circle shown in FIG. 4) including a part of extended portions $101c$ of the region of the first conductive materials $101a$ and $101b$ and a part of the regions of the second conductive materials $102a$ and $102b$ arranged on the either side of the regions of the first conductive materials $101a$ and $101b$. Further, the flange portion of the sealing member is welded on the metal plate member 106 to hermetically seal a semiconductor element.

Figure 11:
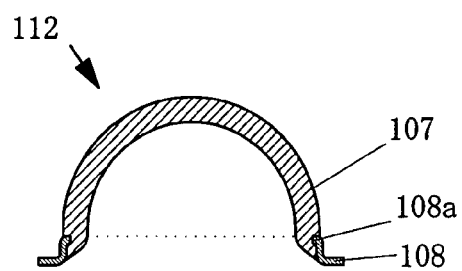
FIG. 11 is a schematic cross-sectional view illustrating a manufacturing process according to an example of the present invention.

FIG. 11 shows a partially sectional enlarged view of the sealing member of the present embodiment, and FIG. 12 shows a partially sectional view of the sealing member. As shown in FIG. 12, the flange portion 108 of the sealing member 112 preferably has a buffer portion $108b$ elastically connected to the insulating substrate $100a$. Due to the buffer portion $108b$, an electrode for welding can be applied to the conductive flange portion 108 without damaging the sealing member 112.

Figure 13:
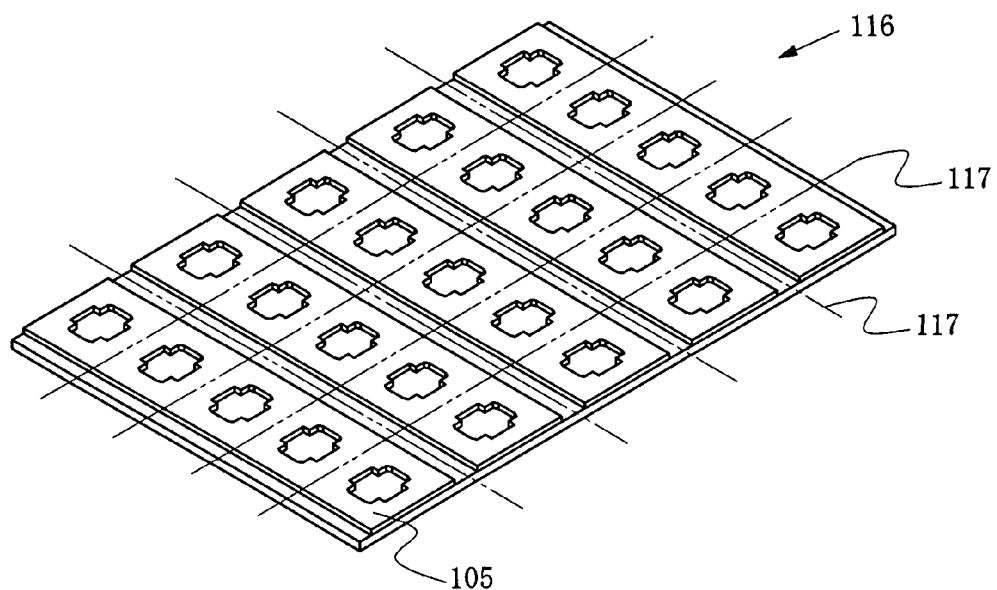
FIG. 13 is a schematic perspective view illustrating a manufacturing process according to an example of the present invention.
Figure 14:
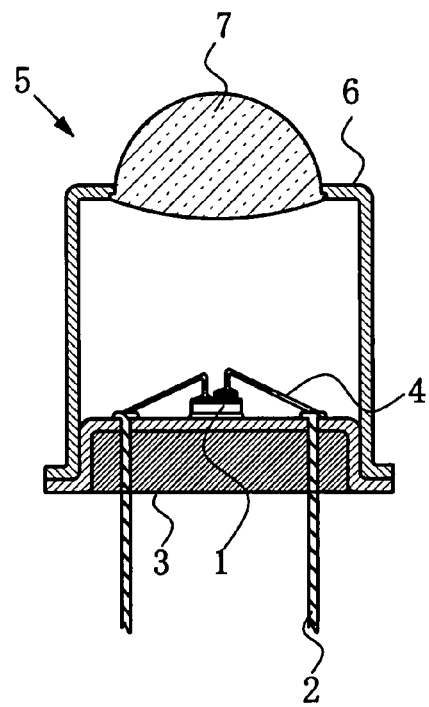
FIG. 14 is a schematic cross-sectional view illustrating a conventional semiconductor device.

FIG. 13 shows a perspective view of an aggregate substrate 116 prior to be divided into respective support members 100 according to the present embodiment. In the aggregate substrate 116, the first conductive material and the second conductive material are continuously arranged respectively on the positions corresponding to the regions of each conductive material of individual support member 100. As shown in FIG. 13, the forming method of the present embodiment preferably has a step for forming the support members 100, by dividing the aggregate substrate 116 into individual pieces along dividing lines 117 that are portions including the regions of the second conductive materials arranged thereon. By dividing the aggregate substrate 116 into individual pieces along the dividing lines 117, the support members 100 having the second conductive material arranged at the edge portion of the external shape can be obtained. Accordingly, the support member 100 having the regions of the second conductive materials $102a$ and $102b$ at either side of the regions of the first conductive materials $101a$ and $101b$ as shown in FIG. 4 can be produced with good mass productivity. Moreover, the dividing lines 117 may be provided in advance to the aggregate substrate 116 in slit-shape or groove-shape so that the aggregate substrate 116 can be readily divided.

In addition, as shown in FIG. 13, the forming method of the present embodiment may further have a step for continuously covering the regions of the first conductive materials $101a$ and $101b$ and the second conductive materials $102a$ and $102b$ with the insulating member 105, and a step for forming the support members 100 by dividing the aggregate substrate 116 into individual pieces using the portions including the insulating member 105 as the dividing lines 117. Accordingly, the support member can be obtained without detaching the conductive materials from the insulating substrate.

There is no need to perform the step of dividing the aggregate substrate to obtain individual support member and the step of welding the sealing member in order. That is, the sealing member may either be welded to the support member prior to dividing the aggregate substrate to obtain individual pieces, or be welded to the individual support member. Each component of the semiconductor device of the present invention will be described in detail below.

[Support Member]

The term "support member" in the present embodiment means a member on which a semiconductor element, a submount, or a sealing member is mounted. Further, the support member comprises electrodes electrically connected to the mounted semiconductor element, and an insulating member holding a conductive plate member which is insulated from the electrodes at a predetermined position so as to electrically isolate the plate member and the electrodes.

As shown in FIG. 4, in the support member 100 of the present embodiment, first conductive materials $101a$ and $101b$ for conductive wiring and a pair of second conductive materials $102a$ and $102b$ symmetrical to the pattern of the first conductive materials $101a$ and $101b$ are disposed on an insulating substrate $100a$. Further, on the conductive materials described above, an insulating member 105 and a fourth conductive material 115 shown in FIG. 5 and an annular metal plate member 106 shown in FIG. 6 are sequentially stacked and bonded to form the support member 100.

Examples of the materials for the insulating substrate in the support member 100 include a glass epoxy resin and a ceramic. Especially, when a ceramic is used for the support member, a semiconductor device with excellent heat resistance can be obtained. In addition, when a material having an expansion coefficient substantially equivalent to that of the sealing member is used, detachment of the sealing member from the support member can be prevented, and a semiconductor device with high reliability can be obtained.

The ceramic used for the insulating substrate is preferably alumina, aluminum nitride, mullite, silicon nitride and the like. A specific example of the ceramics is a ceramic in which 90 to 96 weight % of the raw powder material is alumina and is made by adding 4 to 10 weight % of sintering subsidiary materials such as clay, talc, magnesia, calcia and silica thereto and sintering at a temperature ranging from 1500° C. to 1700° C. Another example is a ceramic substrate in which 40 to 60 weight % of the raw powder material is alumina and made by adding 60 to 40 weight % of sintering subsidiary materials such as borosilicate glass, cordierite, forsterite, mullite, and the like and sintering at a temperature ranging from 800° C. to 1200° C.

A support substrate may be formed by stacking ceramic green sheets obtained by molding a mixed material composed of ceramic materials and an organic binder into a sheet, and sintering it. A conductive wiring provided to such support substrate may be obtained by applying a conductive paste containing a high-melting point metal such as tungsten in a predetermined pattern to a pre-sintered ceramic green sheet, and sintering it. Further, when silver is disposed on the outermost surface by sequentially plating nickel, gold and silver on tungsten, optical reflectance can be improved.

As a bonding material between such insulating substrates using such ceramics, or between such substrate and a conductive plate member, brazing materials made of Au and Ag, or eutectic solders (e.g. Au—Sn, Ag—Sn, Bi—Sn, Zn—Sn, Cu—Sn, In—Sn, and Pb—Sn) can be used.

The semiconductor element or the submount having a flip-chip-mounted semiconductor element is fixed to the support member with a bonding material. Examples of materials for such bonding material include thermosetting resins such as epoxy resins, silicone resins, acrylic resins, and imide resins, razing materials made of Au and Ag, and eutectic solders (e.g. Au—Sn, Ag—Sn, Bi—Sn, Zn—Sn, Cu—Sn, In—Sn, and Pb—Sn). Also, a conductive paste containing metal particles, for example, Ag paste, carbon paste, ITO paste, and Au bump or the like can be suitably selected as the bonding material. When such a conductive paste is used as the bonding material, the semiconductor element can be fixed and electrically connected with the electrodes of the support member. In addition, when a eutectic solder or a conductive paste is used as the bonding material, heat dissipation from the semiconductor element and the submount can be improved.

[Plate Member]

The term "plate member" in the present embodiment means a conductive planar member which is arranged on the support member insulated from the electrode disposed on the support member, and has a main surface to arrange a flange portion of the sealing member. The main surface of the plate member on which the flange portion of the sealing member is arranged is set to a size sufficient to contain at least the entire flange portion of the sealing member.

The plate member may be an insulating plate member having a metal material disposed thereon or may be made of metal material. Such a frame, i.e. plate member, is preferably made of iron-based or copper-based alloy in general. In addition, it is preferable that at least one metal selected from nickel, silver and gold is disposed on the surface of the frame (plate member). When the plate member is covered with such metal, reflectance of light from the semiconductor emitting element can be improved, so that light extraction efficiency of the light emitting device can be improved. Also, when the sealing member is resistance welded to the plate member, high Joule heat is generated at the contact point of the plate member applied with the metal plating, so that a good resistance welding can be obtained.

The plate member on which the sealing member is disposed preferably has a shape engageable with the flange portion of the sealing member. For example, the plate member preferably has an annular groove corresponding to the annular flange portion, at a location where the flange portion of the sealing member is disposed. Because of this configuration, the sealing member can be positioned on the support member with sufficient accuracy in the step of forming the semiconductor device.

It is preferable that at least either the flange portion of the sealing member or the conductive plate member is provided with a protrusion at a location where the flange portion of the sealing member and the conductive plate member contact. For example, when the sealing member is provided with an annular flange portion, an annular protrusion corresponding to the diameter of the flange portion is preferably formed along the circumference of the plate member. Accordingly, when the sealing member is welded by resistance welding to the plate member, high Joule heat is generated at the interface of the protrusion described above, so that a good resistance welding can be carried out.

The material of the plate member of the present embodiment is preferably kovar, iron, stainless steel, aluminum or an alloy containing them. Kovar is a Fe—Ni—Co alloy. When the same material that is exposed on the outermost surface of the flange portion of the sealing member is selected for the material to be exposed on the outermost surface of the plate member, bonding strength can be enhanced, so that good hermetic sealing can be obtained. Moreover, it is preferable that the same kind of metal material is disposed on at least a part of the plate member to be in contact with the flange portion of the sealing member, by using various methods such as plating and sputtering. For example, when silver is disposed on the outermost surface of the flange portion of the sealing member, the outermost surface of the plate member is preferably provided with silver. Accordingly, the flange portion and the plate member can be bonded firmly, so that the semiconductor device with high reliability can be obtained.

[Sealing Member]

The term "sealing member" in the present embodiment means a member disposed on the support member so as to cover the members such as the semiconductor element and conductive wires, in order to protect them from the external environment. The sealing member applied to a semiconductor light emitting element or a photodetector may employ various optical shapes such as a recessed surface, a protruded surface, a spherical surface, a paraboloidal surface, or a combined shape thereof, according to the optical properties of the semiconductor element.

FIG. 11 shows a partially sectional view of the sealing member of the present embodiment, and FIG. 12 shows a partially sectional view of the sealing member. The sealing member of the present embodiment comprises, as shown in FIG. 11, a light transmitting portion 107 which covers the semiconductor element and a conductive flange portion 108 which holds the light transmitting portion 107 and is bonded to the conductive plate member. The light transmitting portion 107 protrudes toward the upper side of the semiconductor device and has a hollow recess opening toward the semiconductor element, and allows light from the light emitting element or light to the photodetector to pass through it. As described above, with the hollow recess opening toward the semiconductor element, the semiconductor element can be hermetically sealed in the hollow portion defined by the sealing member and the support member. In addition, it is preferable that at least one inert gas selected from nitrogen, helium and argon is enclosed in the hollow portion. Accordingly, deterioration of the semiconductor element and a wavelength converting member can be prevented.

As in the present embodiment, when the light emitting element is housed in the hollow portion and hermetically sealed, the size of a light source can be comparatively reduced. That is, if the hollow portion is filled with a light transmitting material, the size of the light source comprising the light emitting element increases due to the lens effect. On the contrary, in the light emitting device of the present embodiment, the light emitting element is housed in a hollow portion so that the size of the light source can be comparatively reduced. Therefore, the luminance per unit area can be increased.

As in the present embodiment, by hermetically sealing the hollow portion, reliability of the light emitting device can be improved. That is, for example, if the hollow portion is filled with a light transmitting member such as a resin, the conductive wire enclosed therein may be broken due to thermal stress exerted from the light transmitting member. However, in the present embodiment, the hollow portion is hermetically sealed and thus use of a member that exerts thermal stress on the conductive wire is eliminated. Therefore, disconnection of the conductive wire can be prevented in the light emitting device of the present embodiment and the light emitting device with high reliability can be obtained.

The flange portion 108 as shown in FIG. 3 and FIG. 11 preferably comprises a contact portion 108a and a buffer portion 108b, as shown in FIG. 12. This is because when the electrode terminal for welding is applied to the flange portion 108, mechanical shock from the electrode terminal can be reduced with the buffer portion 108b. The buffer portion 108b has a shape that is elastic in the direction perpendicular to the insulating substrate of the support member. For example, such shape can be provided by folding the flange portion 108 to give elasticity, bending the flange portion 108 outward, or further, by providing grooves or roughness texture thereon. The flange portion 108 shown in FIG. 12 has a lower surface facing the plate member 106 and an upper surface which is the opposite side from the lower surface. As shown in FIG. 12, the buffer portion 108b of the present embodiment is provided by a groove having a V-shape in cross-section continuously formed along the circumference of the flange portion 108 at corresponding positions of both the upper and lower surfaces.

(Flange Portion)

The flange portion is an annular member made of a metal material, and edge portion of the light transmitting member is fixed to the annular part. In addition, the light transmitting portion made of glass is fixed by fusing its end portion to the flange portion. The material for flange portion is preferably kovar, iron, stainless steel, an aluminum alloy or the like. Here, kovar has approximately the same thermal expansion coefficient as that of the low melting point glass described above, so that the semiconductor element can be hermetically sealed. In addition, at least a part of the flange portion to be contact with the plate member is preferably provided with the same kind of metal (e.g. at least one metal selected from nickel, silver and gold) arranged on the outermost surface of the plate member by using various methods such as plating and sputtering. For example, when silver is disposed on the outermost surface of the plate member, the outermost surface of the flange portion is preferably provided with silver. With this, the flange portion and the plate member can be firmly bonded. Also, at least a part of the surfaces of the flange portion and plate member to be welded each other are preferably coated with a metal such as nickel or gold. Accordingly, the surfaces of the metal (main material of the flange portion and the plate member) to be coated can be protected from chemical change such as oxidation, in the process of welding the flange portion and the plate member. Therefore, the flange portion and the plate member can be firmly bonded without strength degradation of the bond associated with oxidation of the surface of the metal.

(Light Transmitting Portion)

The light transmitting portion of the present embodiment comprises an inner wall surface defining a hollow recess opening toward the semiconductor element and an outwardly protruding outer wall surface which is the reverse side of the inner wall surface. The light transmitting portion is formed with a light transmitting inorganic material including at least one low melting point glass selected from soda glass, silica glass, borosilicate glass, aluminoborosilicate glass, aluminosilicate glass, oxynitride glass, chalcogenide glass and the like. By using such material, degradation due to high intensity light from the light emitting element can be avoided and the semiconductor device having high light stability can be obtained. In addition, when a material having an expansion coefficient substantially equivalent to that of the support member is used for the light transmitting portion, the semiconductor device with high airtightness and high reliability can be obtained.

The outer wall surface of the light transmitting portion 107 can also be an emission observation surface of the light emitting device 100. Thus, in view of the optical properties of the light emitting device, the shape of the outer wall surface of the light transmitting portion 107 is not limited only to that shown in FIG. 1 and may also be selected from various shapes. For example, FIGS. 15 to 18 are perspective views showing the light emitting devices 300, 400, 500, and 600 which are modified examples representing various shapes of the light transmitting portion 107 of the semiconductor device 100 shown in FIG. 1.

Figure 15:
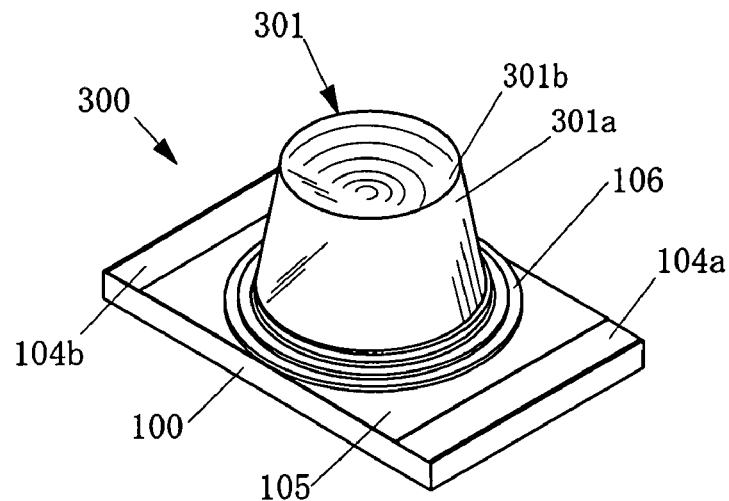
FIG. 15 is a schematic perspective view illustrating a modified example of the present invention.

The outer wall surface of the light transmitting portion 301 shown in FIG. 15 comprises, from the support member 100 of the light emitting device 300, a side surface 301a of a truncated cone, and a top surface of the truncated cone defining an inverted cone-shaped recess 301b. Here, the tip of the inverted cone-shaped recess 301b points toward the emission center of the light source. Accordingly, light emitted from the outer wall surface of the light transmitting portion is concentrated by the side surface 301a and further reflected at the recessed surface 301b, so that light distribution characteristics having a wider range also in the direction parallel to the main surface of the support member 100 of the light emitting device 300 can be obtained.

Figure 16:
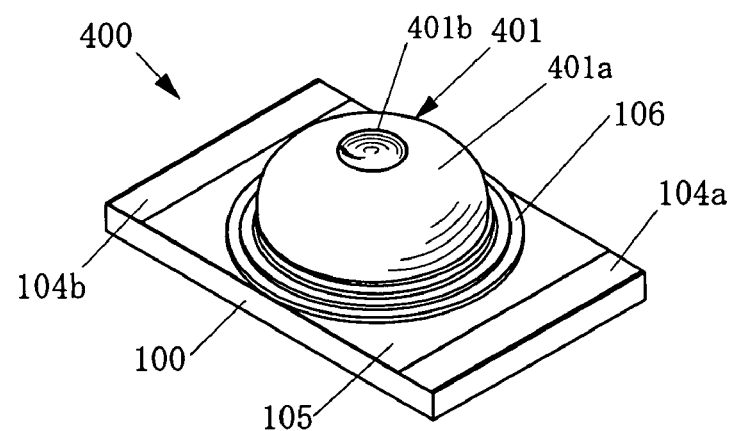
FIG. 16 is a schematic perspective view illustrating a modified example of the present invention.

The outer wall surface of the light transmitting portion 401 shown in FIG. 16 comprises, from the support member 100 side of the light emitting device 400, a semi-elliptic surface 401a with a predetermined oblateness and a top surface defining a semi-elliptic recess 401b with a predetermined oblateness. Accordingly, incident light to the light transmitting portion 401 is collected by the semi-elliptic surface 401a and further reflected at the recessed surface 401b and emitted from the light transmitting portion 401. As a result, the light emitting device 400 can provide a light distribution characteristics having a wider range also in the direction parallel to the main surface of the support member 100 of the light emitting device 400.

Figure 17:
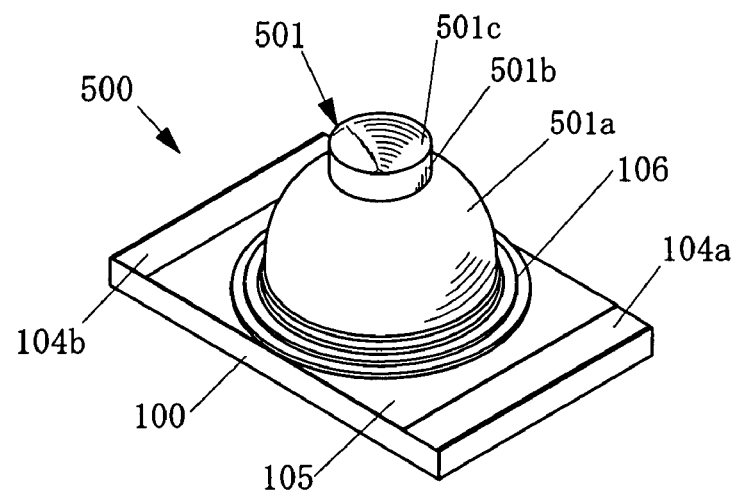
FIG. 17 is a schematic perspective view illustrating a modified example of the present invention.

The outer wall surface of the light transmitting portion 501 shown in FIG. 17 comprises, from the support member 100 of the light emitting device 500, a semispherical surface 501a, a side surface 501b of a cylindrical column formed at the top portion thereof, and a top surface of the cylindrical column defining an inverted cone-shaped recess 501c. Accordingly, incident light to the light transmitting portion 501 is collected by the semi-spherical surface 501a and the side surface 501b and further reflected at the recessed surface 501c and emitted from the outer wall surface of the light transmitting portion 501. As a result, a light distribution characteristics with a wider range also in the direction parallel to the main surface of the support member 100 thereof can be provided to the light emitting device 500.

Figure 18:
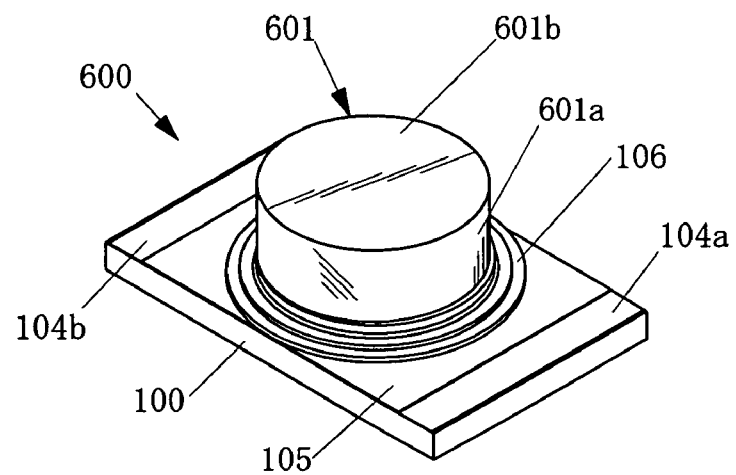
FIG. 18 is a schematic perspective view illustrating a modified example of the present invention.

The outer wall surface of the light transmitting portion 601 shown in FIG. 18 comprises a side surface 601a and an upper surface 601b of a cylindrical column. Here, the side surface 601a of the cylindrical column is perpendicular to the main surface of the support member 100 and the upper surface 601b is a flat surface in parallel with the main surface of the support member. For example, when the upper surface 601b is made in contact with the incident surface of the light transmitting portion (not shown) and is provided separately from the light emitting device 600, the efficiency of entrance of light from the light emitting device to the light transmitting member can be improved.

(Method for Forming the Sealing Member)

FIGS. 7 to 11 are cross-sectional views illustrating each step of a method for forming a sealing member 112 of the present embodiment. A method for forming the sealing member 112 according to the present embodiment will be described below with reference to FIGS. 7 to 11. The forming method described below is an example of method for forming the sealing member 112 of the present embodiment. It is needless to say that the method for forming the sealing member 112 of the present embodiment is not limited thereto.

Figure 7:
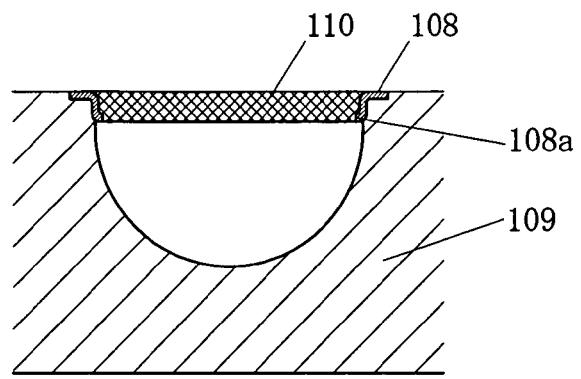
FIG. 7 is a schematic cross-sectional view illustrating a manufacturing process according to an example of the present invention.

First, as shown in FIG. 7, a material 110 for the light transmitting portion formed into a planar shape and engaged within the annular flange portion 108 is placed at the opening edge portion of the first mold 109. The material 110 for the light transmitting portion covers the contact portion 108a. Also, the annular flange portion 108 is placed so that its outer edge is held by a step provided in the opening edge portion of the recess of the first mold 109. The inner wall surface of the first mold 109 is formed to have a predetermined shape to mold the outer wall surface of the light transmitting portion. For example, the inner wall surface may be formed in a shape such as a concave lens shape, a convex lens shape, or a combination thereof. In addition, in the annular part 108 of the flange portion, a contact portion 108a which is made in contact with the edge portion of the light transmitting portion is bent stepwise in cross sectional view. The contact portion 108a is preferably formed inwardly of the annular part. Accordingly, in the sealing member 112, the contact area between the flange portion of the light transmitting portion 107 and the contact portion 108a increases, so that the flange portion and the light transmitting portion can be fixed more firmly.

Figure 8:
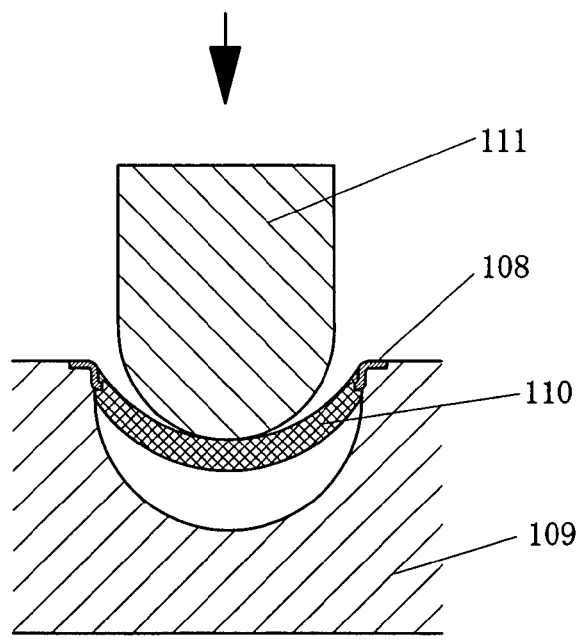
FIG. 8 is a schematic cross-sectional view illustrating a manufacturing process according to an example of the present invention.
Figure 9:
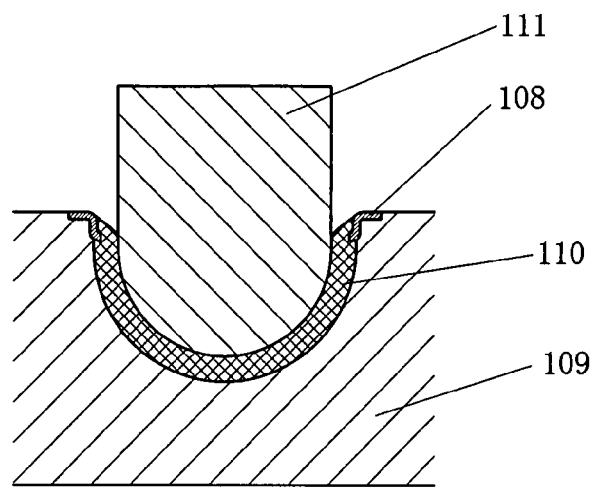
FIG. 9 is a schematic cross-sectional view illustrating a manufacturing process according to an example of the present invention.

Next, as shown in FIG. 8, protruded portion of a second mold 111 is applied to the material of the light transmitting portion 110, and the material of the light transmitting portion 110 is pressed by the second mold 111 at a temperature at which the material of the light transmitting portion 110 softens. The outer wall surface of the second mold 111 is formed to have a predetermined shape to mold the inner wall surface of the light transmitting portion 107. The material of the light transmitting portion 110 is pressed to a predetermined position by the weight of the second mold 111. With this, as shown in FIG. 9, the material of the light transmitting portion 110 is pressed into the gap between the inner wall surface of the recess of the first mold 109 and the outer wall surface of the protrusion of the second mold 111, to the bottom of the recess of the first mold 109. The gap between the inner wall surface of the recess of the first mold 109 and the outer wall surface of the protrusion of the second mold 111 is set to a predetermined distance corresponding to the thickness of the light transmitting portion 107. As for the material of the first mold 109 and the second mold 111, for example, carbon is preferable when glass is used to form the light transmitting portion. This is because good surface condition can be obtained on the outer and inner wall surfaces of the molded light transmitting member.

Figure 10:
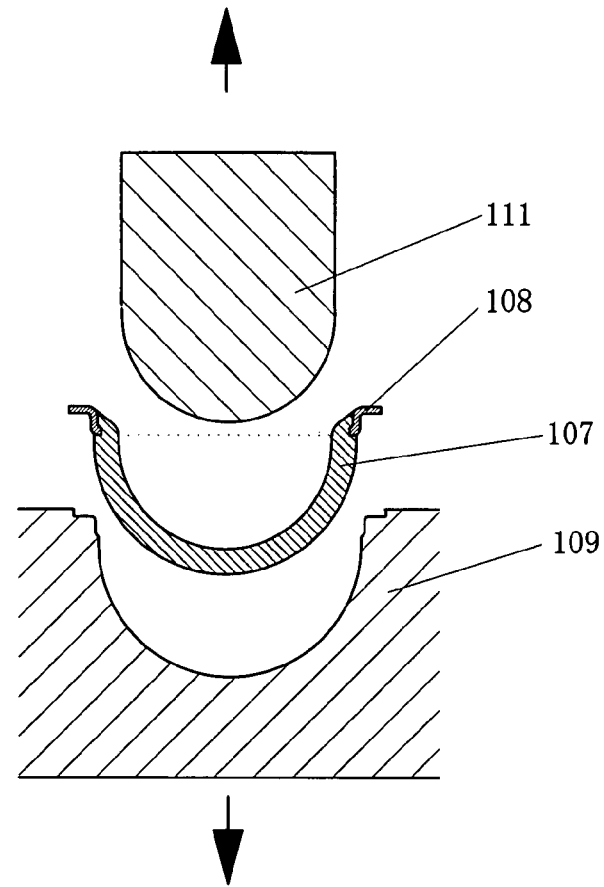
FIG. 10 is a schematic cross-sectional view illustrating a manufacturing process according to an example of the present invention.

The sealing member 112 is formed by curing the softened material of the light transmitting portion 110 to form the light transmitting portion, and fixing the light transmitting portion and the flange portion together. Then, as shown in FIG. 10, the cured light transmitting portion and the flange portion are taken out from the mold, and heating, washing and the like is applied thereto to obtain the sealing member 112 (shown in FIG. 11) in which transmittancy has been improved. Further, in order to protect the surface of the flange portion 108, the surface thereof is covered with a metal. As described above, coating of the flange portion is preferably carried out after fixing the light transmitting portion 107 to the flange portion 108. This is because adhesion between the light transmitting portion and the flange portion can be improved when the contact portion 108a is not covered with a metal which functions as a protective film against the external environment. This is because, for example, adhesion between the glass and the contact portion of the flange portion made of kovar can be improved when the surface of the kovar is exposed without being covered with other metal materials, or rather is oxidized.

[Semiconductor Element]

As the semiconductor element of the present embodiment, a light emitting element, a photodetector, and a protective element (e.g. a Zener diode and a condenser) that protects such semiconductor elements from damage caused by overvoltage, or combination of two or more thereof may be employed. Here, a light emitting element (LED chip) will be described as an example of the semiconductor element. Examples of such a semiconductor light emitting element which is a component of the LED chip include various semiconductors such as ZnSe and GaN. However, for a light emitting device having a fluorescent material, a nitride semiconductor ($In_XAl_YGa_{1-X-Y}N$, $0 \leq X$, $0 \leq Y$, $X+Y \leq 1$) capable of emitting light with a short-wavelength which sufficiently excites the fluorescent material is preferable. Various wavelengths of emission can be selected according to the materials and the mixed crystal ratio of the semiconductor layer.

The electrode of the semiconductor element can be connected electrically and mechanically to the electrode of the support member via a conductive material, a so-called bump, or can also be connected electrically and mechanically to an auxiliary support member, a so-called submount.

Examples of the present invention will be described in detail below. However, it is needless to say that the present invention is not limited to the examples described below.

Example 1

FIG. 1 shows a schematic perspective view of a semiconductor device according to the present example. FIG. 2 shows a schematic top view of a semiconductor device according to the present example. FIG. 3 shows a schematic cross-sectional view of a semiconductor device according to the present example. In addition, FIG. 13 is a schematic perspective view of a ceramics substrate 116 which is an aggregate of the support members 100. FIGS. 1 to 3 show individual piece of the ceramics substrate obtained by dividing the ceramics substrate 116, which is an aggregate of the support members, according to a predetermined size of the light emitting device.

(Semiconductor Device)

As shown in FIGS. 1 to 3, a semiconductor device 200 of the present example comprises a semiconductor element 113, a support member 100 having an insulating substrate 100a provided with conductive materials to form a pair of positive and negative electrodes, a sealing member 112 covering the semiconductor element 113 disposed on the support member 100.

As shown in FIG. 4, the support member 100 of the present example comprises an insulating substrate 100a having a rectangular shape in plan view, a pair of regions 101a and 101b of a first conductive material, arranged in order in a longitudinal or longer direction of the insulating substrate 100a (hereinafter, in the main surface of the insulating substrate 100a, the longitudinal or longer direction may be indicated as "Y-axis direction", and the shorter direction may be indicated as "X-axis direction"), and a pair of regions 102a and 102b of a second conductive material arranged along the longitudinal direction of the rectangular insulating substrate 100a, and separated from the regions of the first conductive materials 101a and 101b. The pair of first conductive materials of the present example are arranged as the first regions 101a and 101b, separated at the central portion of the support member 100, and as a pair of conductive wires, they electrically connect the semiconductor element 113 and the external electrodes of the semiconductor device 200. A region extending in the x-axis direction in the center portion of the support member 100 where the regions of the first conductive materials 101a and 101b are separated, is an insulating portion where the insulating substrate 100a is exposed from the conductive member. That is, the insulating portion of the present example is an exposed region of the insulating substrate 100a determined by the edges of the region 101a of the first conductive material and opposite region 101b of the first conductive material. Further, a part of the insulating portion is arranged so as to extend in each of the X axis directions from the center portion of the support member. In addition, the regions of the pair of first conductive materials 101a and 101b are arranged in U-shapes symmetrical to each other in plan view. Also, the regions of the pair of the second conductive materials 102a and 102b are, in the same plan view, arranged so as to interpose the pair of regions of the first conductive materials 101a and 101b, to extend in the longitudinal direction of the insulating substrate, in strip-shape symmetrical to each other with respect to the regions of the pair of first conductive materials. Further, the regions of the pair of second conductive materials 102a and 102b are arranged so that each extends in the longitudinal direction toward the corresponding corners of the main surface of the support member, along the regions of the first conductive materials 101a and 101b and a side of the insulating portion.

The support member of the present example has a region 103 of the third conductive material at the center portion of the main surface on which the first and second conductive materials are disposed, and the regions of the first conductive materials 101a and 101b each have the extended portion 101c extending along the sides of the central portion to surround a part of the region of the third conductive material 103. In other words, the third conductive material 103 is arranged between the U-shaped regions of the first conductive materials 101a and 101b. The regions of the first conductive materials 101a and 101b and the regions of the second conductive materials 102a and 102b respectively have shapes symmetrical to the region of the third conductive material 103. Further, first extended portions connected to the first conductive material 101a and second extended portions connected to the first conductive material 101b are arranged opposite to each other with a predetermined distance between the edges thereof. Consequently, the outer edge of the region of the third conductive material 103 is surrounded by the regions of a pair of the first conductive materials 101a and 101b, except for a separation area where the insulating substrate is exposed between the edges of the extended portions of the first conductive material. Moreover, the first and second conductive materials are covered continuously with an insulating member 105.

(Formation of Support Member)

The support member of the present example will be described in detail below. FIGS. 4 to 6 are schematic top views sequentially illustrating each step of a process for forming the support member according to the present example. The support member of the present example is, as shown in FIGS. 4 to 6 in sequence, is formed by sequentially stacking each conductive material, the insulating member 105, and the annular plate member 106 on the insulating substrate 100a. FIG. 13 is a schematic perspective view of a ceramics substrate 116 which is an aggregate of the support members.

The insulating substrate of the present example is a ceramic substrate comprising aluminum nitride, and on which, as a first conductive material, a pair of positive and negative conductive wirings as shown in FIG. 4 are formed in symmetrical shapes with respect to the center portion of the support member. Further, a second conductive material is disposed along the both sides of the arranged pattern of the first conductive material, symmetrical to each other with respect to the pattern of the first conductive material, in a pair of stripes insulated from the conductive wiring.

In more detail regarding each electrode, as the first and second conductive materials, NiB/NiP/Au with the thickness of 1 μm/2 μm/0.5 μm are stacked in sequence on an underlayer of tungsten of 10 μm thickness on an aluminum substrate of 1.0 mm thickness. Detachment of each conductive material from the plate member of aluminum nitride can be prevented with these materials. In the present example, the forming method of the first to fourth conductive materials can be selected from various forming methods such as vacuum evaporation, sputtering, plating, and printing. Also, the first to fourth conductive materials can be selected to be all the same material or at least two of the first to fourth conductive materials can be selected to be same material or they can all be selected to be different conductive materials.

Further, as the insulating member 105 which continuously covers the conductive wiring and the stripe-shaped conductive materials, a thin film of aluminum nitride (30 μm in thickness) is disposed in a pattern such as shown in FIG. 5 and FIG. 13. FIG. 13 shows a ceramic substrate 116 which is an aggregate of the support members. The support member of the present example is formed by dividing the ceramics substrate 116 by way of dicing along the dividing lines 117. The dividing lines 117 are provided in a grid pattern in the longitudinal and lateral directions on the main surface of the ceramics substrate 116, as shown in FIG. 13 in dotted lines.

In the state of the ceramic substrate 116 shown in FIG. 13 before it is cut into individual pieces, the insulating member 105 is formed continuously on the ceramics substrate 116 except for the exposed regions for the conductive wires and the electrodes 104a and 104b and the region for the third conductive material. As described above, by disposing the insulating member 105 so as to cover the first conductive material and stripe-shaped second conductive material which are used as the conductive wiring, warpage of the support member can be reduced.

The outer edges of the electrodes 104a and 104b of the present example are disposed at a distance of at least 7 mm from the outer edges of the arrangement pattern of each conductive material from which the electrodes are needed to be insulated. Accordingly, short circuit can be prevented between the electrodes 104a and 104b and the conductive plate material 106 on which the sealing member is disposed, and a semiconductor device of a reduced size can be obtained.

As shown in FIG. 5, in the support member of the present example, tungsten/NiB/NiP with the thickness of 20 μm/1 μm/2 μm are disposed in sequence as a fourth conductive material 115 on a thin film of aluminum nitride with a thickness of 30 μm disposed as the insulating member 105. As shown in FIGS. 4 and 5, the fourth conductive material 115 has an annular shape corresponding to the shape of the annular plate member 106 and is arranged along the circumference shown in FIG. 4 by a dotted circle, over the region including the extended portions 101c of the regions of the first conductive materials 101a and 101b and a part of the regions of the second conductive materials 102a and 102b, via the insulating member 105. Moreover, in plan view of the support member, the extended portions 101c of the regions of the first conductive materials 101a and 101b and the region of the third conductive material 103 are arranged within the opening portion made by the insulating member 105, the annular fourth conductive material 115, and the annular plate member 106. In addition, the region of the fourth conductive material 115 includes a region protruding outward from a part of the annular edge so as to facilitate electric connection of the electrode terminal for resistance welding. Further, an annular plate member 105 of 150 μm in thickness comprising kovar is bonded to the fourth conductive material 115 by using a brazing material of 30 μm in thickness containing silver and copper. Adhesion with the brazing material is improved by disposing the brazing material via NIP as described above, so that detachment of the brazing material can be prevented. Also, by stacking NiP via NiB, deterioration of NiP due to the temperature associated with bonding of the plate member can be prevented, so that the bonding strength of the plate member can be improved.

About 8 μm of difference is obtained when the heights of the sealing member at the bonding surface are measured as an indication of amount of warpage of the support member of the present example. With a support member formed without the second conductive material as a comparative example, about 15 μm of difference is obtained when the heights of the sealing member at the bonding surface are measured. Thus, warpage is reduced in the support member according to the present example.

(Formation of Submount)

In the submount 114 on which the light emitting element is flip-chip-mounted, a conductive wiring is provided on a plate member comprising aluminum nitride. The submount of the present example is disposed above the third conductive material region which is separated from the first and second conductive materials and comprises the same material as that of the first and second conductive materials, via a eutectic material. The third conductive material is preferably disposed by using a screen printing. The third conductive material is disposed with grooves in a grid shape formed by a mesh screen. Accordingly, even when air bubbles are formed between the submount and the third conductive material, the bubbles can be dispersed, so that adhesion between the submount and the support member can be improved.

In the conductive wiring of the submount 114, titanium (Ti)/copper(Cu)/nickel(Ni)/gold(Au) are stacked in sequence on the surface side of the plate member by way of sputtering. The thickness of the conductive wiring is about 0.1 μm. With these metal materials, detachment of conductive wiring from the plate member of aluminum nitride can be prevented, so that reliability of the semiconductor device can be improved. Further, titanium (Ti), harder than other metals, is applied on the submount, so that chipping or cracking on the submount can be prevented.

The light emitting element of the present example is a LED chip. In the light emitting device of the present example, a plurality of LED chips is flip-chip-mounted on the same submount. That is, the light emitting element of the present example has a pair of positive and negative electrodes on the same surface side. The electrodes are arranged to face the conductive wiring via gold bumps, and electrically and mechanically connected by welding to the conductive wiring by applying a load, ultrasonic waves and heat thereto. Further, the submount is fixed by an Au—Sn eutectic material to the third conductive material exposed from the insulating member of the support member. As for the mounting position of the light emitting elements or the submount, the position of the light emitting elements relative to the submount, or the position of the submount relative to the main surface of the support member is adjusted so that the light emitting elements are located almost at the center of the light transmitting portion as viewed from directly above the light emitting device. Further, these LED chips are covered with a wavelength converting member containing a fluorescent material.

(Formation of Wavelength Converting Member)

The fluorescent material contained in the wavelength converting member is a fluorescent material represented by the general formula $(Y_{0.995}Gd_{0.005})_{2.750}Al_5O_{12}:Ce_{0.250}$ with a main diameter of 8 μm. The material of the wavelength converting member is a hardenable composition of a fluorescent material and a silicone resin that is a binding agent, obtained by including 20 to 75 wt % of the fluorescent material into the silicone resin and agitating in a self-centrifugal rotation mixer for 5 minutes. Further, by hardening the hardenable composition at 150° C. for one hour, a wavelength converting member with a thickness in a range of 70 μm to 80 μm, covering the side surfaces and the upper surface of the LED chips can be obtained.

The conductive wiring of the submount 114 connected with the electrode of the LED chips and the conductive wiring of the first conductive material formed on the support member are connected by conductive wires (not shown). In addition, at the opposite side thereof interposing the submount 114, a Zener diode is disposed as a protective element on the conductive wiring of the support member and electrically connected thereto.

(Sealing Member)

The flange portion 108 of the sealing member 112 is placed on the annular plate member 106. Then voltage is applied to the flange portion 108 of the sealing member 112 and the plate member 106. At this time, the electrode terminal for applying voltage is contacted to the buffer portion 108b of the flange portion 108. Accordingly, the flange portion 108 of the sealing member 112 and the plate member 106 are resistance welded without damaging the light transmitting portion 107 of the sealing member 112, and the semiconductor element is hermetically sealed. The sealing member 112 comprises a light transmitting portion 107 made of soda glass and a flange portion 108 to which the light transmitting portion 107 is engaged. The emission surface of the light transmitting portion 107 is a hemispherical convex surface projecting in upward direction of the light emitting device 200, and the incident surface facing the light emitting element 113 is a hemispherical concave surface having approximately the same curvature of that of the emission surface. The flange portion 108 is an annular member comprising kovar, and edge portion of the light transmitting member 107 which is a hemispherical lens made of soda glass is fixed thereto by welding. Further, the light emitting element 113 is hermetically sealed in the hollow portion defined by the sealing member and the main surface of the support member.

The light emitting device according to the present invention is superior in reliability and thermal resistance and capable of emitting high output light. Therefore, the light emitting device of the present invention is widely applicable to the light source of lighting that can displace conventional light sources such as a light bulb and a fluorescent lamp, and a lighting fixture for a vehicle.

This application is based on Japanese Patent Application Nos. 2006-55671 filed on Mar. 2, 2006 and 2006-253835 filed on Sep. 20, 2006, the contents of which are incorporated hereinto by reference.

What is claimed is:

1. A semiconductor device comprising:
a support member having an insulating substrate and a pair of first conductive materials disposed on the insulating substrate, one of said first conductive materials being disposed adjacent a first end portion of said insulating substrate and another of said first conductive materials being disposed adjacent a second end portion opposite to said first end portion, and said support member also having a pair of second conductive materials on the insulating substrate, one of said second conductive materials being disposed adjacent a third end portion of said insulating substrate and another of said second conductive materials being disposed adjacent a fourth end portion opposite to said third end portion, said third and fourth end portions being longer than said first and second end portions; and
a sealing member covering a semiconductor element arranged on said support member;
wherein said support member has an insulating portion where the insulating substrate is exposed between the pair of the first conductive materials, and at least one of the pair of the second conductive materials is arranged adjacent to a side of the insulating portion, and
said sealing member is disposed so that said sealing member covers at least a part of at least one of the first conductive materials and the second conductive materials.

2. A semiconductor device comprising:
a support member having an insulating substrate and a pair of first conductive materials disposed on the insulating substrate, one of said first conductive materials being disposed adjacent a first end portion of said insulating substrate and another of said first conductive materials being disposed adjacent a second end portion opposite to said first end portion, and said support member also having a pair of second conductive materials which are different from the first conductive materials and the second conductive materials being disposed on the insulating substrate, one of said second conductive materials being disposed adjacent a third end portion of said insulating substrate and another of said second conductive materials being disposed adjacent a fourth end portion opposite to said third end portion, said third and fourth end portions being longer than said first and second end portions; and
a sealing member covering a semiconductor element arranged on said support member;
wherein shapes of regions of the pair of the first conductive materials are symmetrical to each other in plan view,
shapes of regions of the pair of the second conductive materials are symmetrical to each other across a symmetry axis of the shapes of the regions of the first conductive materials in plan view, and
said sealing member is disposed on the support member so that at least a part of a region on the support member including at least one of the first conductive materials and the second conductive materials is overlayed by said sealing member.

3. The semiconductor device according to claim 1, wherein the regions of the second conductive materials have strip shapes disposed on an upper surface of the support member and are extending in a longitudinal direction of the insulating substrate.

4. The semiconductor device according to claim 2, wherein the regions of the second conductive materials have strip shapes disposed on an upper surface of the support member and are extending in a longitudinal direction of the insulating substrate.

5. The semiconductor device according to claim 1, wherein the insulating substrate has a third conductive material arranged on a central portion of the insulating substrate and the shapes of the regions of the first conductive materials have extended portions that substantially surround the third conductive material.

6. The semiconductor device according to claim 2, wherein the insulating substrate has a third conductive material arranged on a central portion of the insulating substrate and the shapes of the regions of the first conductive materials have extended portions that substantially surround the third conductive material.

7. The semiconductor device according to claim 1, wherein said sealing member has a flange portion elastically connected to said support member.

8. The semiconductor device according to claim 7, wherein the flange portion of said sealing member includes at least one of a notch and recess therein.

9. The semiconductor device according to claim 2, wherein said sealing member has a flange portion elastically connected to said support member.

10. The semiconductor device according to claim 9, wherein the flange portion of said sealing member includes at least one of a notch and recess therein.

11. The semiconductor device according to claim 1, wherein the respective second conductive materials on the insulating substrate are rectangularly shaped and extend parallel to the longitudinal direction of the insulating substrate.

12. The semiconductor device according to claim 2, wherein the respective second conductive materials on the insulating substrate are rectangularly shaped and extend parallel to the longitudinal direction of the insulating substrate.

13. The semiconductor device according to claim 1, wherein said sealing member is disposed on the support member so as to overlay at least portions of the pair of first conductive materials and the pair of second conductive materials.

14. The semiconductor device according to claim 2, wherein said sealing member is disposed on the support member so as to overlay at least portions of the pair of first conductive materials and the pair of second conductive materials.

15. The semiconductor device according to claim 1, wherein at least one of the pair of the second conductive materials has a longitudinal axis extending parallel to a longitudinal axis of the insulating substrate.

16. The semiconductor device according to claim 2, wherein at least one of the pair of the second conductive materials has a longitudinal axis extending parallel to a longitudinal axis of the insulating substrate.

17. A semiconductor device comprising:
   a support member having an insulating substrate and a pair of first conductive materials disposed on the insulating substrate, one of said first conductive materials being disposed adjacent a first end portion of said insulating substrate and another of said first conductive materials being disposed adjacent a second end portion opposite to said first end portion, and a pair of second conductive materials on an insulating substrate, one of said second conductive materials being disposed adjacent a third end portion of said insulating substrate and another of said second conductive materials being disposed adjacent a fourth end portion opposite to said third end portion, said third and fourth end portions being longer than said first and second end portions; and
   a sealing member covering a semiconductor element arranged on said support member;
   wherein said support member has an insulating portion where the insulating substrate is exposed between said first conductive materials, and at least one of the pair of the second conductive materials is arranged so as to extend in a longitudinal direction of the insulating substrate.

* * * * *